(12) United States Patent
Fujii

(10) Patent No.: US 7,671,432 B2
(45) Date of Patent: Mar. 2, 2010

(54) DYNAMIC QUANTITY SENSOR

(75) Inventor: Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 423 days.

(21) Appl. No.: 11/709,271

(22) Filed: Feb. 22, 2007

(65) Prior Publication Data
US 2007/0158822 A1  Jul. 12, 2007

Related U.S. Application Data

(62) Division of application No. 10/695,785, filed on Oct. 30, 2003, now abandoned.

(30) Foreign Application Priority Data

Nov. 7, 2002 (JP) ............................. 2002-323896
Oct. 7, 2003 (JP) ............................. 2003-348253

(51) Int. Cl.
H01L 29/84 (2006.01)
H01L 25/07 (2006.01)
G01P 9/04 (2006.01)
G01C 19/56 (2006.01)

(52) U.S. Cl. .................. 257/419; 257/414; 257/659; 257/660; 257/676; 257/690; 257/704; 257/710; 257/787; 257/790; 257/E23.181

(58) Field of Classification Search ................ 257/704, 257/710, 924, E23.18–E23.193, 226, 232, 257/254, 414–440, 470, 678–733, 790, E21.499–E21.502
See application file for complete search history.

(56) References Cited

U.S. PATENT DOCUMENTS

| | | | |
|---|---|---|---|
| 4,891,984 A | 1/1990 | Fujii | |
| 5,668,033 A * | 9/1997 | Ohara et al. | ................. 438/113 |
| 5,756,901 A | 5/1998 | Kurle et al. | |
| 5,773,881 A | 6/1998 | Kato | |
| 5,864,062 A | 1/1999 | Nagahara et al. | |
| 6,035,712 A | 3/2000 | Ohta et al. | |
| 6,255,741 B1 * | 7/2001 | Yoshihara et al. | ........... 257/792 |
| 6,313,529 B1 | 11/2001 | Yoshihara et al. | |
| 6,316,840 B1 | 11/2001 | Otani | |
| 6,323,550 B1 | 11/2001 | Martin et al. | |
| 6,405,592 B1 | 6/2002 | Murari et al. | |
| 6,435,028 B1 | 8/2002 | Nagahara | |
| 6,441,481 B1 | 8/2002 | Karpman | |

FOREIGN PATENT DOCUMENTS

JP      A-2001-133479      5/2001

OTHER PUBLICATIONS

Office Action from U.S. Patent Office issued on Dec. 2, 2004 for the corresponding U.S. Appl. No. 10/695,785.

(Continued)

Primary Examiner—Jasmine J Clark
(74) Attorney, Agent, or Firm—Posz Law Group, PLC

(57) ABSTRACT

A dynamic quantity sensor includes a sensor chip having a movable portion at one surface side thereof and a silicon layer at another surface side thereof. The movable portion is displaced under application of a dynamic quantity. The silicon layer is separated from the movable portion through an insulator. The dynamic quantity sensor also includes a circuit chip for transmitting/receiving electrical signals to/from the sensor chip. The circuit chip is disposed to confront the one surface of the sensor chip through a gap portion and cover the movable portion. The sensor chip and the circuit chip are bonded to each other around the gap portion so that a bonding portion is formed to substantially surround the gap portion and thereby seal the gap portion.

8 Claims, 11 Drawing Sheets

OTHER PUBLICATIONS

Office Action from U.S. Patent Office issued on Mar. 25, 2005 for the corresponding U.S. Appl. No. 10/695,785.
Office Action from U.S. Patent Office issued on Aug. 30, 2005 for the corresponding U.S. Appl. No. 10/695,785.
Advisory Action from U.S. Patent Office issued on Dec. 7, 2005 for the corresponding U.S. Appl. No. 10/695,785.
Office Action from U.S. Patent Office issued on Mar. 17, 2006 for the corresponding U.S. Appl. No. 10/695,785.
Office Action from U.S. Patent Office issued on Oct. 24, 2006 for the corresponding U.S. Appl. No. 10/695,785.
Advisory Action from U.S. Patent Office issued on Feb. 6, 2007 for the corresponding U.S. Appl. No. 10/695,785.
Notice of Reason for Refusal dated Oct. 9, 2007 in corresponding Japanese Patent Application No. 2003-348253 (and English translation).

* cited by examiner

DYNAMIC QUANTITY SENSOR

CROSS REFERENCE TO RELATED APPLICATIONS

This application is a division of application Ser. No. 10/695,785 filed on Oct. 30, 2003, now abandoned which is based upon, claims the benefit of priority of, and incorporates by reference, the contents of Japanese Patent Application No. 2002-323896 filed on Nov. 7, 2002 and the contents of Japanese Patent Application No. 2003-348253 filed on Oct. 7, 2003.

FIELD OF THE INVENTION

The present invention relates to a dynamic quantity sensor that includes a sensor board having a movable portion displaced under application of a dynamic quantity and that also includes a circuit board for transmitting/receiving electrical signals to/from the sensor board.

BACKGROUND OF THE INVENTION

Dynamic quantity sensors such as acceleration sensors or the like generally include a protection cap formed of resin, ceramic, silicon or the like on a sensor board having a movable portion for covering the movable portion and thereby protecting the movable portion of the sensor board (see Patent Document 1 (JP-A-10-253652), for example).

Furthermore, when a circuit board for transmitting/receiving electrical signals to/from a sensor board is combined with the sensor board and these boards are packaged by mold material such as resin or the like, a structure is adopted that generally includes a sensor board 10 having a protection cap CP fixed thereto and a circuit board 20 mounted on a lead frame 50 as shown in FIG. 19.

However, in this case, a plurality of boards 10, 20 are mounted on the flat plane, which causes the package body to be designed in a large size and need a protection cap CP. This accordingly leads to increased costs.

A structure has been proposed in which a sensor board having a movable portion and a circuit board are laminated together so that the movable portion is covered by the circuit board to thereby omitting the protection cap. Also, electrode bumps are formed on the circuit board so that the circuit board and the sensor board are connected to each other through the electrode bumps (see Patent Document 2 (JP-A-2001-227902), for example). In the laminate structure of the sensor board and the circuit board through the electrode bumps as described above, the sensor body can be miniaturized more than the case in which both the boards are mounted on the flat plane. However, there will still be a higher cost because it is necessary to form electrode bumps on the circuit board.

SUMMARY OF THE INVENTION

Therefore, in view of the foregoing problem, an object of the present invention is to provide a dynamic quantity sensor equipped with a circuit board and a sensor board having a movable portion that can be implemented at a low cost and compact size and without a protection cap.

In order to attain the above object, according to a first aspect of the present invention, a dynamic quantity sensor including a sensor board having a movable portion equipped at one surface side thereof, the movable portion being displaced under application of a dynamic quantity, and a silicon layer equipped at another surface side thereof, the silicon layer being separated from the movable portion through an insulator, and a circuit board for transmitting/receiving electrical signals to/from the sensor board, is characterized in that the circuit board is disposed so as to confront one surface of the sensor board through a gap portion and to cover the movable portion. The sensor board and the circuit board are bonded to each other around the gap portion so that the bonding portion is formed to surround the gap portion.

According to the dynamic quantity sensor described above, both the circuit board and the sensor board are bonded to each other and laminated at a low cost by merely disposing a bonding member between both the boards. As another method, the bonding between both the boards can be performed without any bonding member by using direct bonding between both the boards. The movable portion of the sensor board is covered by the circuit board through the gap portion and the periphery of the gap portion is surrounded by the bonding portion, so that the movable portion is properly protected from external forces and thus no protection cap is needed.

Furthermore, the sensor board has the movable portion which is equipped at one surface side thereof so as to be displaced under application of a dynamic quantity, and the silicon layer which is equipped at the other surface side thereof so as to be separated from the movable portion by an insulator 15. Therefore, the electrical and magnetic shielding at the sensing portion containing the movable portion can be properly performed.

Accordingly, according to the present invention, the dynamic quantity sensor equipped with the sensor board having the movable portion and the circuit board can be implemented at a low cost and a compact size while omitting a protection cap.

According to a second aspect of the present invention, the sensor board and the circuit board may be electrically connected to each other by bonding wires to perform the electrical connection between both boards at a low cost.

According to a third aspect of the present invention, in the dynamic quantity sensors of the first and second aspects of the present invention, the sensor board and the circuit board 20 may be sealingly wrapped by mold material. Even in this case, the movable portion is protected by the circuit board and the bonding portion and thus the mold material can be properly prevented from entering into the movable portion.

According to a fourth aspect of the present invention, the sensor board and the circuit board may be sealed by soft material softer than the mold material and the outside of the soft material may be wrapped by the mold material. When the sensor board and the circuit board are sealed by the mold material, stress caused by temperature variation or the like in use is applied to the elements thus sealed. However, soft material as described above effectively moderates the stress by being interposing between the circuit and the mold material.

According to a fifth aspect of the present invention, a recess portion is formed on a surface of the circuit board facing the sensor board and the gap portion is constructed by the recess portion. Also, the bonding portion is formed at sites other than the recess portion on the circuit board. With this construction, the gap portion can be properly formed by the recess portion formed on the circuit board.

According to a sixth aspect of the present invention, the sensor board may be designed to have a plurality of movable portions formed on one surface thereof. In this case, the circuit board covers each movable portion through the gap portion whose periphery is surrounded by the bonding portion. When a plurality of movable portions are equipped on the sensor board, the area of the gap portion between the circuit board and the sensor board is increased to cover the plurality of movable portions.

According to a seventh aspect of the present invention, a rim portion abutting against the sensor board is formed at a site on the circuit board which faces areas other than the area having the plurality of movable portions formed therein on the sensor board. In this case, the rim portion effectively mechanically supports both of the boards.

According to an eighth aspect of the present invention, when the sensor includes a lead frame for transmitting electrical signals to an exterior device, the sensor board can be bonded to the lead frame on another surface opposite to one surface of the sensor board facing the circuit board.

According to a ninth aspect of the present invention, in the case in which the sensor includes the lead frame for transmitting the electrical signals to an exterior device, an overhang area which does not face the sensor board and overhangs from the sensor board is equipped on the surface of the circuit board facing the sensor board. The lead frame may be bonded to the overhang area on the circuit board. The construction of this aspect is effective to such a case that the circuit board is larger than the sensor board and thus the circuit board partly overhangs from the sensor board. According to this construction, it is unnecessary to directly fix the sensor board to the lead frame which is normally formed of metal. This construction leads to the improved results of a sensor board that hardly suffers from the effects of thermal stress caused by temperature variation or the like and that achieves more stable sensor characteristics.

According to a tenth aspect of the present invention, an overhang area which does not face the sensor board and that overhangs from the sensor board is equipped on the surface of the circuit board which faces the sensor board, and a separate board separated from the sensor board is equipped to the overhang area on the circuit board so that the circuit board is supported by the separate board. The construction of this aspect is effective to such a case that the circuit board is larger than the sensor board and thus the circuit board partially overhangs from the sensor board. According to this construction, the overhang area of the circuit board is supported by the separate board so that the circuit board can be stably supported and that the wire-bonding to the circuit board can be effectively performed.

According to an eleventh aspect of the present invention, a plurality of sensor boards may be bonded to the circuit board. When the circuit board is larger than one sensor board and includes the plurality of sensor boards, an area overhanging from one sensor board exists on the circuit board. However, according to the eleventh aspect of the present invention, another sensor board brings the same effect as the separate board as the tenth aspect of the present invention. That is, according to this aspect, in addition to the effect as the tenth aspect, the plurality of sensor boards can be arranged.

According to a twelfth aspect of the present, a dynamic quantity sensor including a sensor board having a movable portion equipped at one surface side thereof, the movable portion being displaced under application of a dynamic quantity, and a circuit board for transmitting/receiving electrical signals to/from the sensor board is characterized in that the circuit board is disposed so as to confront one surface of the sensor board through a gap portion and to cover the movable portion. The sensor board and the circuit board are partially bonded to each other around the gap portion.

According to this aspect, both the boards can be bonded to each other at a low cost and laminated by merely disposing a bonding member between the circuit board and the sensor board. In addition, the movable portion of the sensor board is covered by the circuit board through the gap portion so that the movable portion can be properly protected from the exterior and thus no protection cap is needed.

Therefore, the dynamic quantity sensor equipped with the sensor board having the movable portion and the circuit board can be implemented at a low cost and a compact size while omitting the protection cap.

The reference numerals in parentheses representing the respective means described above are provided as examples to show the corresponding relationship with specific means described in the following embodiments.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
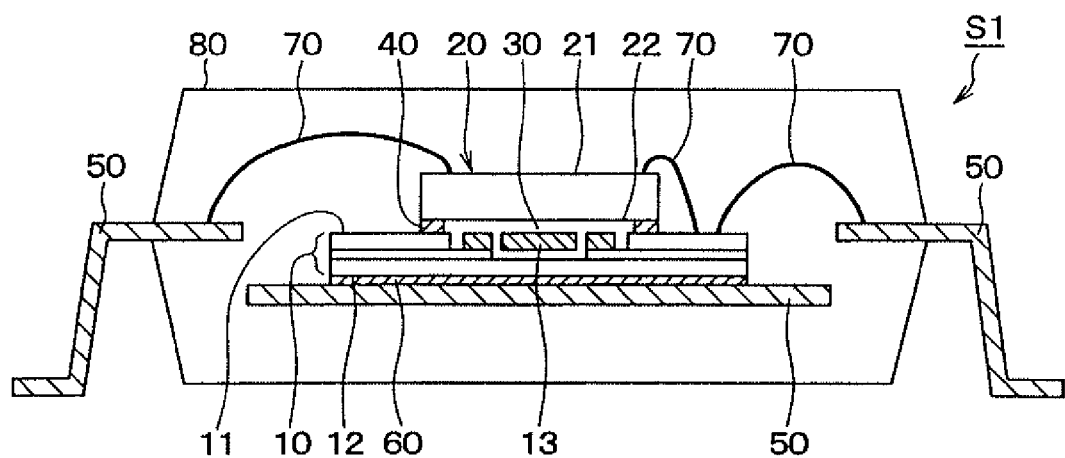
FIG. 1 is a schematic cross-sectional view showing an acceleration sensor according to a first embodiment of the present invention.

Preferred embodiments according to the present invention will be described hereunder. In the following embodiments, the same parts are represented by same reference numerals to simplify the description thereof.

First Embodiment

Figure 2A:
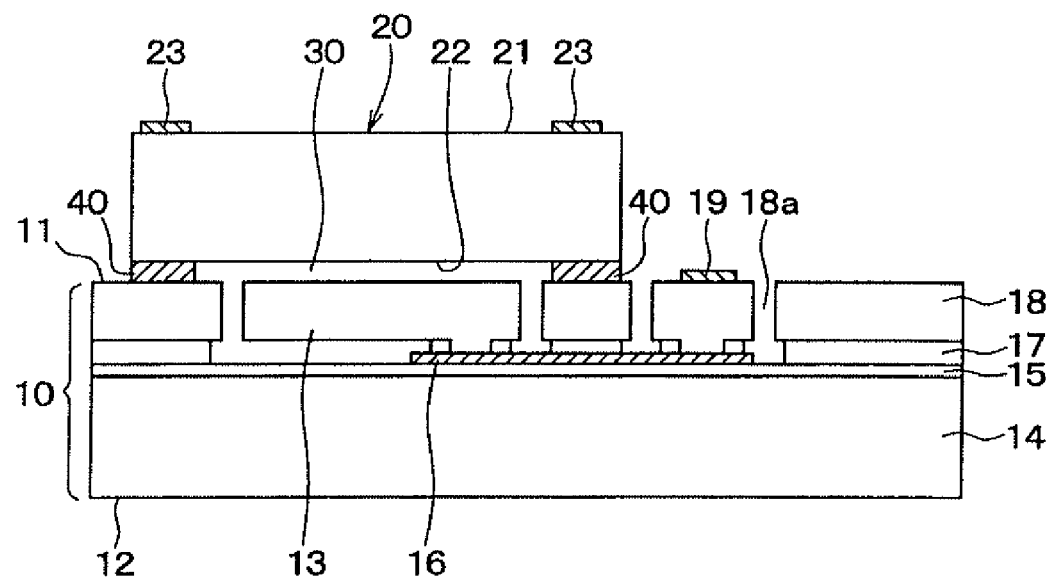
FIGS. 2A and 2B are enlarged views of the sensor board and circuit board shown in FIG. 1.

FIG. 1 is a schematic cross-sectional view showing an acceleration sensor (sensor) S1 as a dynamic quantity sensor according to a first embodiment of the present invention. FIG. 2A is an enlarged view showing a sensor board 10 and a circuit board 20 which are laminated to be unified into one body in FIG. 1.

The sensor S1 includes a sensor board 10 having a movable portion 13 disposed at one surface side (or top surface side) 11. The movable portion 13 is displaced under application of acceleration (dynamic quantity). The sensor S1 further includes a circuit board 20 for transmitting and receiving electrical signals to and from the sensor board 10.

In the first embodiment the sensor board 10 and circuit board 20 are preferably implemented as chips (hereafter, "sensor chip" and "circuit chip", respectively) by subjecting a wafer-type material to dicing-cutting or the like. The circuit board 20 is preferably an IC chip formed of silicon semiconductor or the like. A surface (or top surface) 21 of the circuit board 20 serves as a circuit-forming surface on which circuit elements are formed. The circuit board 20 is disposed so that its back surface 22 at the opposite side to the circuit-forming surface 21 faces the one surface 11 of the sensor board 10 through a gap portion 30 while covering the movable portion 13.

The back surface 22 of the circuit board 20 is bonded to the one surface 11 of the sensor board 10 through a bonding member around the gap portion 30 to thereby form a bonding portion 40. The bonding portion 40 is designed to have an annular shape that substantially surrounds the periphery of the gap portion 30 to thereby sealing the gap portion 30.

Referring to FIG. 1, the bonding member constituting the bonding portion 40 functions as a spacer. More particularly, the bonding portion 40 results in the formation of a gap portion 30 that prevents the movable portion 13 of the sensor board 10 from coming into contact with the back surface 22 of the circuit board 20. An adhesive agent containing low-melting glass, beads or the like, or material having a thickness as a spacer such as an adhesive sheet or the like may be used as the bonding member.

Returning to FIG. 2A, an exemplary implementation of the sensor board 10 of the first embodiment will be discussed. The sensor board 10 is designed by laminating plural silicon layers, silicon oxide films, etc. The detailed construction of the sensor board 10 as described above is disclosed in FIG. 7 of JP-A-9-129898, the contents of which are incorporated by reference.

In the sensor board 10, a first silicon oxide film 15 is formed on a first silicon layer 14 by thermal oxidation or the like. An electrically conductive layer 16 formed from polysilicon is formed on the first silicon oxide film 15 by a CVD (Chemical Vapor Deposition) method or the like. A second silicon oxide film 17 is formed on the first silicon oxide film 15 by CVD, a sputtering method, a vapor deposition method or the like. Then, a second silicon layer 18 is formed on the second silicon oxide film 17 by CVD or the like to thereby achieve a laminate structure. The electrically conductive layer 16 may be formed not only from polysilicon, but also from a high melting point metal such as tungsten, molybdenum or the like, or silicide (a compound of silicon and the above metal) or the like.

Next, grooves 18a are formed in the second silicon layer 18 in conformity with a pattern of the movable portion 13, a fixed portion, etc. The second silicon oxide film 17 is then etched and removed in proper areas through the grooves 18a. The second silicon layer 18 is resultantly formed into the movable portion 13 and the fixed electrode corresponding to the fixed portion, etc. in the areas from which the second silicon oxide film 17 is removed.

The movable portion 13 of this embodiment is preferably formed as a cantilevered portion supported at only one site and is disposed to face a fixed electrode (not shown for ease of illustration) through a gap in the vertical direction to the sheet plane of FIG. 2A. When acceleration is applied to the movable portion 13, it is displaced in the vertical direction to the sheet plane of FIG. 2A, so that the interval between the movable portion 13 and the fixed electrode is varied. The variation of the interval between the movable portion 13 and the fixed electrode causes variation of the capacitance between both the electrodes, and thus the applied acceleration is detected on the basis of an electrical signal caused by the capacity variation between both the electrodes.

As mentioned above, the movable portion 13 is preferably supported at only one site thereof (i.e., cantilevered) in this embodiment. However, the movable portion 13 may also be supported at two sites thereof (i.e., straddled) or at three or more sites thereof. In this case, the movable portion 13 and the fixed electrode, that is, the sensing portion is covered by the circuit board 20 in the sensor board 10 as shown in FIG. 2A, and electrical signals from the sensing portion are picked up through the electrically conductive layer 16 extending from the position just below the circuit board 20 to the outside of the circuit board 20.

The electrically conductive layer 16 is conducted to the second silicon layer 18 at a site overhanging from the position just blow the circuit board 20. Pads 19 formed of aluminum or the like are formed on the surface of the second silicon layer 18 at this site (the surface 11 of the sensor board 10). The pads 19 are subjected to wire bonding or the like to electrically connect the sensor board 10 and the circuit board 20 or the lead frame 50.

Figure 2B:
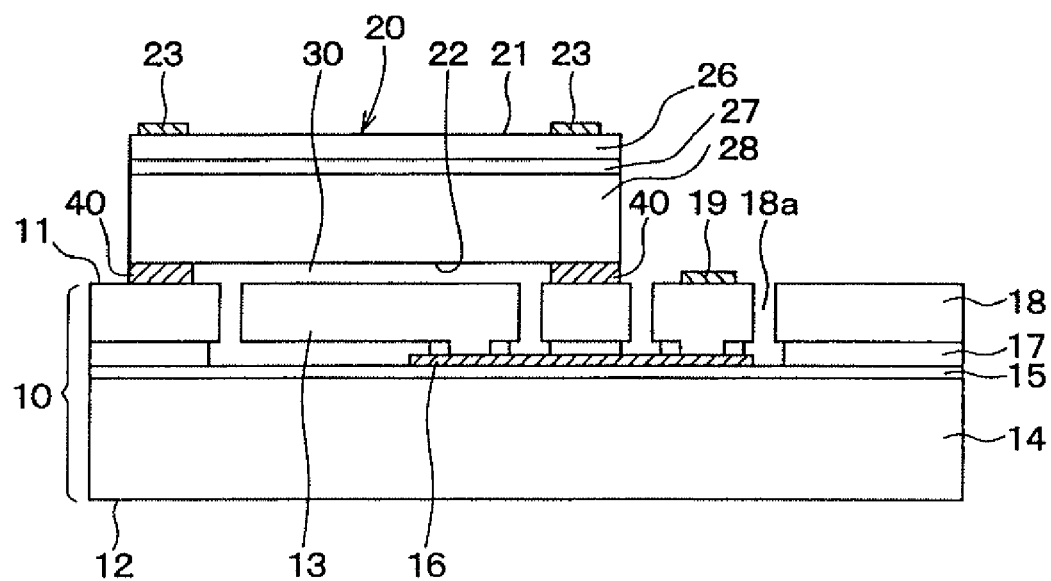

Referring to FIG. 2B, an exemplary implementation of the sensor board 10 and its sensing portion will be discussed. In this example, an SOI structure having a laminate structure including a first silicon layer 26, a silicon oxide layer 27 and a second silicon layer 28 is used to implement the circuit board 20. Circuit elements are formed on the first silicon layer 26 and the second silicon layer 28 is used as a shield layer for the sensing portion. The second silicon layer 28 and the sensor board 10 are electrically connected to each other by using an electrically conductive adhesive agent as the bonding portion 40. At this time, the area of the sensing portion which is bonded by the bonding portion 40 is wire-bonded to a bonding pad equipped in an area (not shown) to set the area concerned to a constant voltage such as 0 V (ground) or the like.

The sensing portion (electrode portion) of the capacitance type accelerator of this embodiment can be shielded when the first silicon layer 14 as a support portion in the sensor board 10 is bonded to a lead frame 50 (described later) by an electrically conductive adhesive agent or the like to set the first silicon layer 14 to 0V. This is preferable because the capacitance type sensor handles a minute variation of capacitance. This implementation can provide a more stable output even when resin mold is applied.

More particularly, in this embodiment, as shown in FIG. 2, the sensor board 10 is equipped with the movable portion 13 at the one surface side thereof so that the movable portion 13 is displaced by application of a dynamic quantity, and also the first silicon layer (silicon layer) 14 at the other surface side thereof so that the first silicon layer 14 is separated from the movable portion 13 by the first silicon oxide film (insulator) 15. Therefore, the shielding of the sensing portion containing the movable portion 13 can be properly performed.

In this embodiment, the electrical connection between the sensor board 10 and the external device as described above is performed by providing the lead frame 50 through which electrical signals from the sensor board 10 are transmitted as shown in FIG. 1. The lead frame 50 is formed of metal such as copper or the like, or metal which is matched in thermal expansion coefficient with the silicon board such as, for example, 4-2 Alloy, covar or the like.

Another surface 12 at the opposite side to the one surface 11 of the sensor board 10 facing the back surface 22 of the circuit board 20 is bonded to the lead frame 50 through an adhesive member 60 such as adhesive agent, adhesive sheet or the like.

As shown in FIGS. 1, 2A and 2B, the electrical connection among the sensor board 10, the circuit board 20 and the lead frames 50 is performed through the pads 19 of the sensor board 10 and the pads 23 formed on the surface 21 of the circuit board 20 and through the bonding wires of gold, aluminum or the like formed by wire-bonding.

A mold material 80 wraps and seals the sensor board 10, the circuit board 20, the bonding wires 70 and parts of the lead frame 50. The mold material 80 is preferably mold resin such as generally-used epoxy resin or the like.

An exemplary methodology for manufacturing the acceleration sensor S1 as described above will now be discussed. The circuit board 20 and the sensor board 10, which are unified into one body through the boding member, are mounted and fixed through the adhesive member 60 onto the lead frame 50. Alternatively, the sensor board 10 is mounted and fixed through the adhesive member 60 onto the lead frame 50, and then the circuit board 20 is mounted and fixed through the bonding member on the sensor board 10.

Thereafter, the electrical connection is performed among the sensor board 10, the circuit board 20 and the lead frame 50 by the wire bonding, and then the molding process using the mold material 80 is carried out by using a metal mold. Thereafter, segmentalization or the like of the lead frame 50 is carried out to complete the acceleration sensor S1 shown in FIG. 1.

In the acceleration sensor S1 described above, when acceleration is applied, the electrical signal corresponding to the applied acceleration is output from the sensor board 10 by the action of the movable portion 13 described above. This electrical signal is subjected to signal processing such as amplification, adjustment, etc. in the circuit board 20, and then transmitted from the lead frames 50 through the bonding wires 70 to the outside.

According to the acceleration sensor S1 shown in FIG. 1, both the circuit board 20 and the sensor board 10 can be bonded to each other and laminated at a low cost by merely disposing the bonding member between both the boards 20 and 10. The movable portion 13 of the sensor board 10 is covered by the circuit board 20 through the gap portion 30. The periphery of the gap portion 30 is sealingly surrounded by the bonding portion 40, so that the movable portion 13 is properly protected from an external device (or generally from external disturbances) and no protection cap is needed.

As another method, the bonding between both the boards 10, 20 can be performed without any bonding member by using direct bonding between both of the boards 10, 20.

Furthermore, as described above, the sensor board 10 has the movable portion 13 at one surface side thereof so that the movable portion 13 is displaced under application of a dynamic quantity, and the silicon layer 14 equipped at the other surface side thereof so that it is separated from the movable portion 13 by an insulator 15. Therefore, the shielding of the sensing portion containing the movable portion 13 can be properly performed.

Therefore, according to the acceleration sensor S1 shown in FIG. 1, a dynamic quantity sensor can be implemented at a low cost and compact size with no protection cap.

Furthermore, according to the sensor S1, the sensor board 10 and the circuit board 20 are electrically connected to each other through the bonding wires 70, and the electrical connection between both the boards 10, 20 can also be implemented at a low cost.

The electrical connection between the sensor board 10 and the circuit board 20 may be performed in a manner other than the direct connection using bonding wires between both the boards. For example, the lead frame 50 which is electrically connected to the circuit board 20 through the bonding wires or the like may be connected to the sensor board 10 by wire bonding to thereby electrically connect both the boards 10, 20 through the lead frame.

Furthermore, in the acceleration sensor S1 shown in FIG. 1, the sensor board 10, the circuit board 20 and the bonding wires 70 are wrapped and sealed by the mold material 80. In this case, the movable portion 13 is protected by the circuit board 20 and the bonding portion 40 so that the mold material 80 is properly prevented from entering the area of the movable portion 13.

Figure 3:
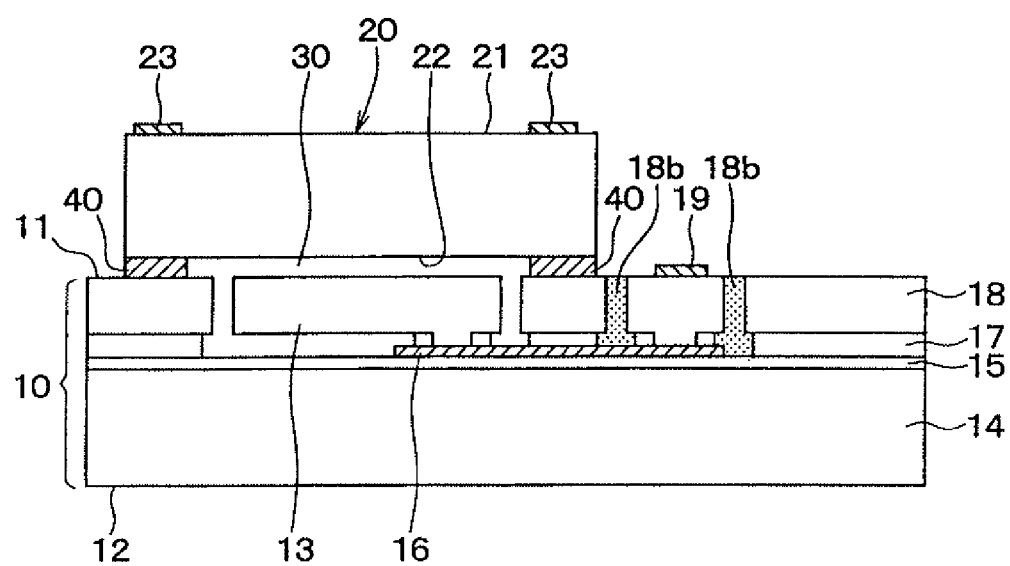
FIG. 3 is a schematic cross-sectional view showing a modification to the first embodiment.

FIG. 3 is a schematic cross-sectional view showing another example of the sensor board 10 according to a first modification to the first embodiment. In the sensor board 10, insulating material 18b formed of silicon oxide or the like may be formed by CVD or the like is embedded around the conductive layer 16 and the second silicon layer 18 having the pads 19 formed thereon to keep electrical insulation around the conductive layer 16.

Figure 4:
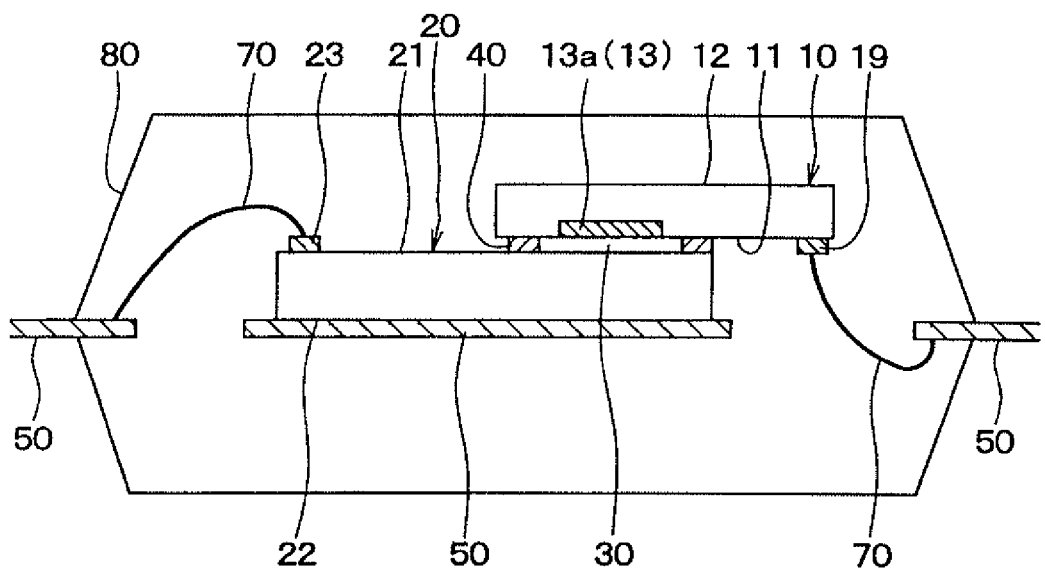
FIG. 4 is a schematic cross-sectional view showing another modification to the first embodiment.

In the example of FIG. 1, the circuit board 20 is disposed so that the back surface 22 at the opposite side to the surface (circuit-formed surface) 21 of the circuit board 20 faces the one surface 11 of the sensor board 10. However, the surface 21 of the circuit board 20 and the one surface 11 of the sensor board 10 may be confronted to each other as shown in FIG. 4. In this case, the back surface 22 of the circuit board 20 fixedly adheres to the lead frame 50.

In FIG. 4, the area in which the movable portion 13 and the fixed electrode are formed at the one surface 11 side of the sensor board 10 is represented by a sensing portion 13a, and the gap portion 30 through which the sensing portion 13a is partitioned from the outside is formed by the surface 21 of the circuit board 20 and the bonding portion 40.

Second Embodiment

Figure 5:
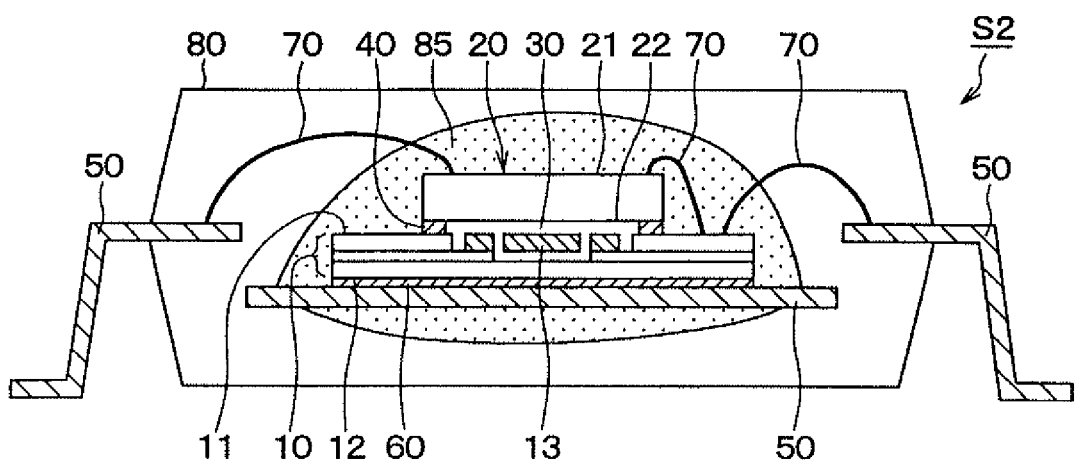
FIG. 5 is a schematic cross-sectional view showing an acceleration sensor according to a second embodiment of the present invention.

Referring to FIG. 5, a second embodiment of the acceleration sensor S2 will now be discussed. In this embodiment, the sensor board 10, the circuit board 20 and the bonding wires 70 are sealed by a soft material 85 softer than the mold material 80, and the outside of the soft material 85 is wrapped by the mold material 80.

More particularly, the acceleration sensor S2 is designed so that the soft material 85 is interposed between the mold material 80 and each of the sensor board 10, the circuit board 20 and the bonding wires 70 in the acceleration sensor S1 shown in FIG. 1. The soft material 85 may be silicone gel, soft resin, rubber or the like; however, the soft material should be softer than the mold material 80. The sealing targets 10, 20, 70 are coated with the soft material 85 in advance, and then the molding process using the mold material 80 is applied to thereby form the acceleration sensor S2 shown in FIG. 5.

When the sensor board 10, the circuit board 20 and the bonding wires 70 are sealed by the mold material 80, stress caused by the temperature variation is applied to these sealing targets 10, 20, 70. However, according to this embodiment, this stress is effectively moderated by interposing the soft material 85.

Third Embodiment

Figure 6:
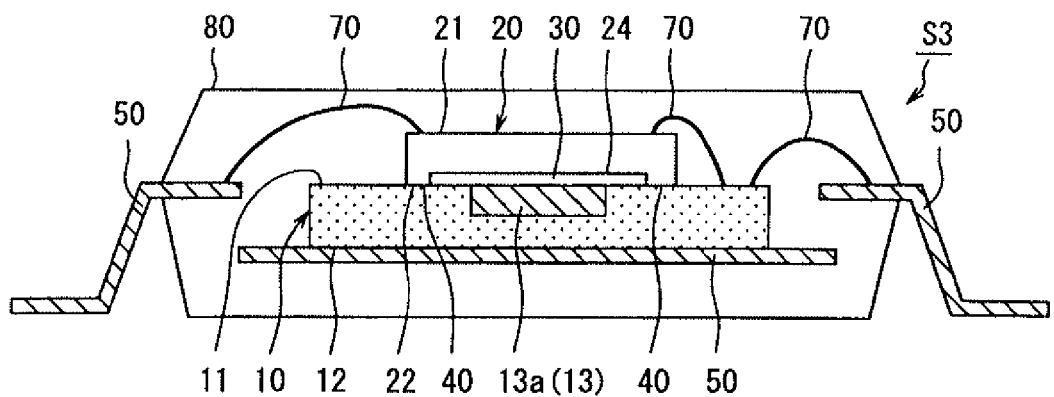
FIG. 6 is a schematic cross-sectional view showing an acceleration sensor according to a third embodiment of the present invention.

Referring to FIG. 6, a third embodiment of the acceleration sensor S3 will be discussed. The acceleration sensor S3 is achieved by equipping a recess portion 24 to the circuit board 20 of the acceleration sensor S1 as shown in FIG. 1. The other surface 12 at the opposite side to the one surface 11 of the sensor board 10 facing the back surface 22 of the circuit board 20 is bonded to the lead frame 50 through an adhesive member such as adhesive agent, adhesive sheet or the like (not shown for ease of illustration).

In this embodiment, as shown in FIG. 6, a recess portion 24 is formed on the confronting face (back surface) 22 of the circuit board 20 which confronts the sensor board 10, and the gap portion is formed by the recess portion 24. The bonding portion 40 is formed at a site different than the recess portion 24 of the circuit board 20.

A thin portion is partially formed on the back surface 22 of the circuit board 20 by wet or dry etching of silicon or the like to form the recess portion 24. The etching for forming the recess portion 24 may be performed as a lump in every wafer.

The thick portion other than the recess portion 24 of the circuit board 20 is bonded to the one surface of the sensor board 10 by using adhesive agent or the like, so that the bonded portion serves as the annular bonding portion 40. As described above, the gap portion 30 in the recess portion 24 is sealed, and the sensing portion 13a on the sensor board 10 is protected from the external. That is, the movable portion 13 is protected from the external.

In this case, the gap portion 30 can be properly formed by the recess portion 24 formed on the circuit board 20. Therefore, it is unnecessary to dispose the bonding member constituting the bonding portion 40 which is thick enough to function as a spacer as in the case of the first embodiment.

Figure 7:
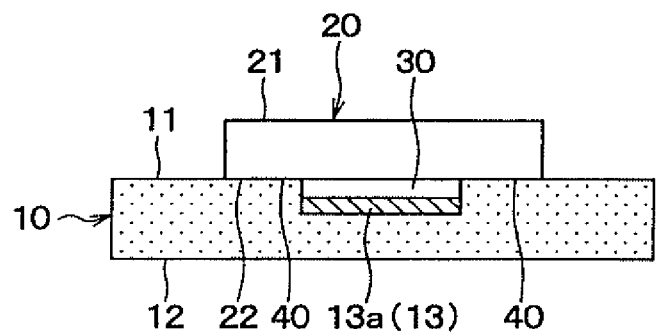
FIG. 7 is a schematic cross-sectional view showing a modification to the third embodiment.

Referring to FIG. 7, a first modification to the third embodiment will be discussed. The sensor board 10 may be designed so that the sensing portion 13a containing the movable portion 13 is formed at a position deeper than the one surface 11 of the sensor board 10. The sensor board 10 as described above is formed in the following manner or the like. That is, an area in which the sensing portion 13a will be formed is recessed in advance by etching, and then the sensing portion 13a is formed in the area.

In the sensor board 10 as described above, the gap portion 30 is formed by the sensing portion 13a which is recessed from the one surface 11, so that the gap portion 30 can be properly formed without a need to form the recess portion 24 in the circuit board 20 as in FIG. 6.

As described above, according to this embodiment, when the gap portion 30 is formed, the confronting face of the circuit board 20 or the sensor board 10 is designed to have a recess portion, whereby the gap portion can be properly formed.

Fourth Embodiment

Figure 8:
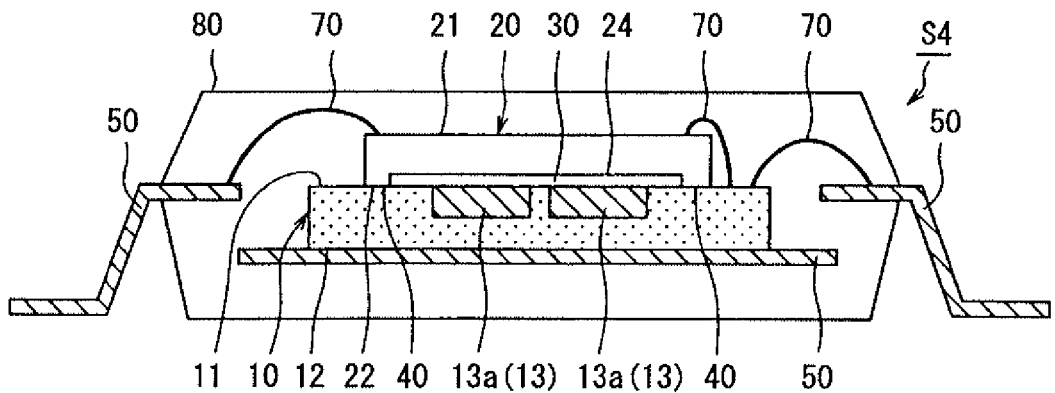
FIG. 8 is a schematic cross-sectional view showing an acceleration sensor according to a fourth embodiment of the present invention.

Referring to FIG. 8, a fourth embodiment of an acceleration sensor S4 will be discussed. In this embodiment, a plurality of movable portions 13 are disposed on the one surface 11 of the sensor board 10.

Figure 9:
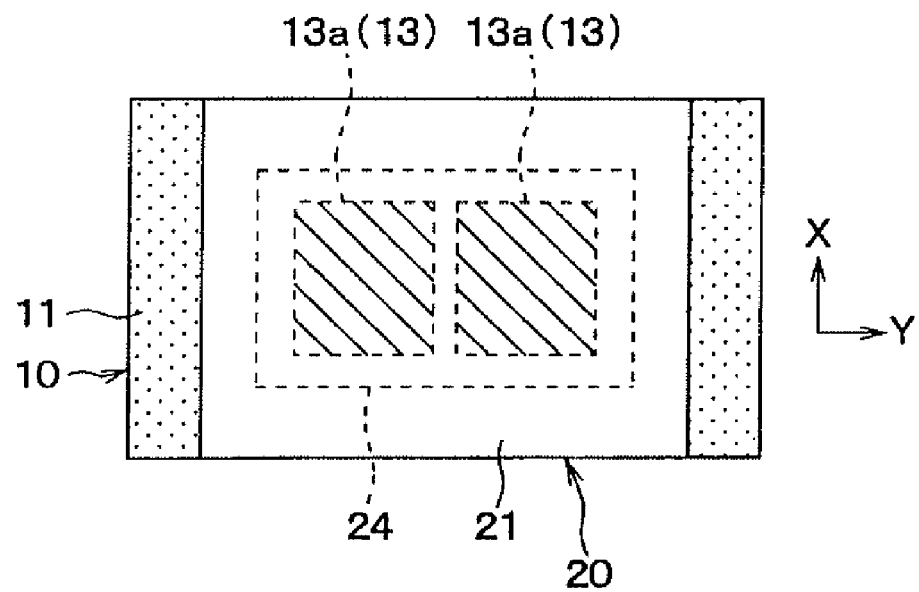
FIG. 9 is a plan view of the circuit board in FIG. 8 when viewed from the top side.

As shown in FIGS. 8, 9, two sensing portions 13a, each of which containing the movable portion 13, are formed on the one surface 11 of the sensor board 10. In this case, the other surface 12 at an opposite side to the one surface 11 of the sensor board 10 facing the back surface 22 of the circuit board 20 is bonded to the lead frame 50 through an adhesive member such as adhesive agent, adhesive sheet or the like (not shown).

When the two sensing portions 13a are formed as described above, they may be designed so that one of the sensing portions 13a detects acceleration in the X-axis direction while the other sensing portion 13a detect the acceleration in a Y-axis direction perpendicular to the X-axis direction as indicated by the axes in FIG. 9. More generally, the two sensing portions 13a can implement a multi-axial sensor. If three or more sensing portions are equipped, further multi-axial detections can be performed.

In this case, the recess portion 24 is formed on the back surface 22 of the circuit board 20 facing the one surface 11 of the sensor board 10, and each of the sensing portions 13a is covered through the gap portion 30 by the recess portion 24.

A thick portion of the circuit board 20 (the portion other than the recess portion 24) is bonded to the one surface of the sensor board 10 by using adhesive agent or the like, and the portion thus bonded serves as the bonding portion 40. The bonding portion 40 is formed so as to substantially if not completely surround the gap portion 30 to thereby seal the gap portion 30.

Furthermore, when a plurality of movable portions 13 are disposed on the sensor board 10 as in this embodiment, the area of the gap portion 30 between the circuit board 20 and the sensor board 10 is increased to cover the plurality of movable portions 13.

Figure 10:
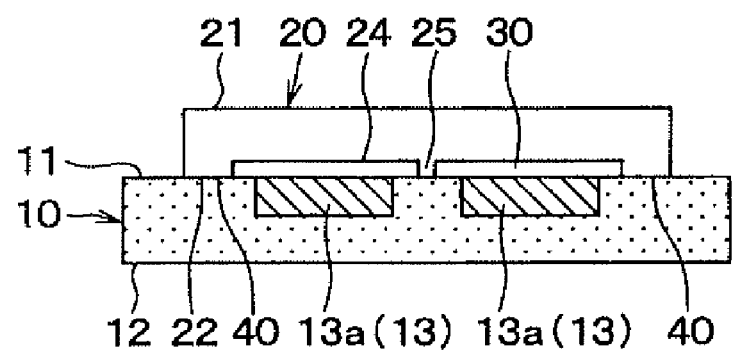
FIG. 10 is a schematic cross-sectional view showing a modification to the fourth embodiment.

Referring to FIG. 10, a first modification to the fourth embodiment will be discussed. In this case, a rim portion 25 which projects from the bottom portion of the recess portion 24 and abuts against the sensor board 10 may be formed at a site of the circuit board 20 which faces an area other than the area of the sensor board 10 where the plurality of movable portions 13 are formed.

The rim portion 25 may be formed as a part of the circuit board 20 or it may be formed as a spacer such as low-melting glass, adhesive agent or the like. With this construction, the rim portion 25 can effectively support both the boards 10, 20 mechanically even when the recess portion 24 has a large area.

Fifth Embodiment

Figure 11:
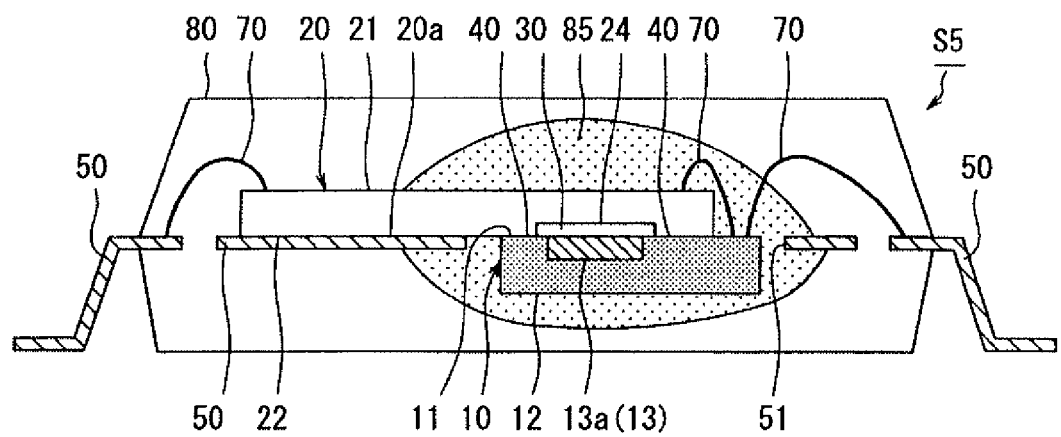
FIG. 11 is a schematic cross-sectional view showing an acceleration sensor according to a fifth embodiment of the present invention.
Figure 12:
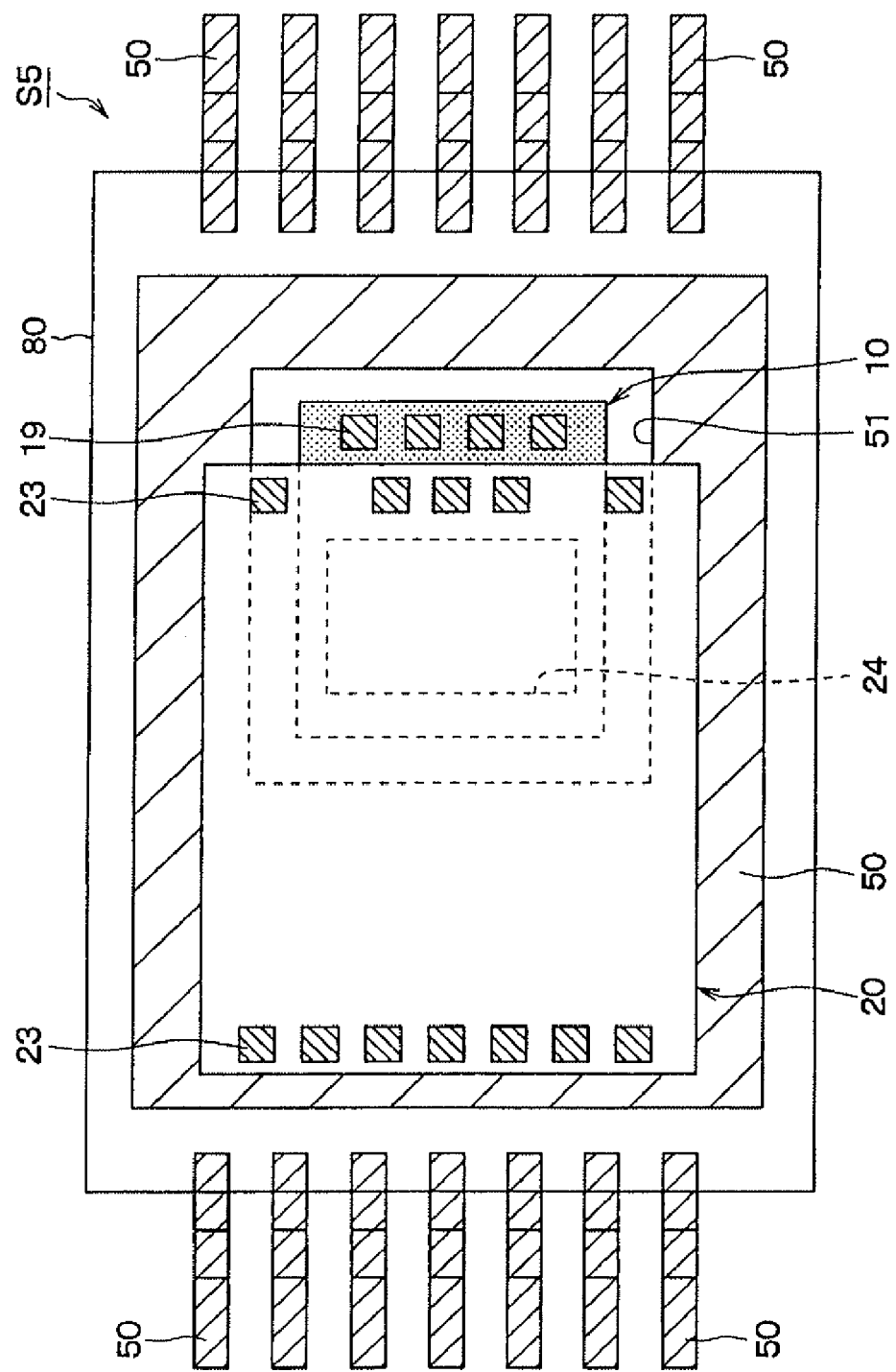
FIG. 12 is a plan view of the accelerator in FIG. 11 when viewed from the top side.

Referring to FIGS. 11-12, a fifth embodiment of the acceleration sensor S5 will be discussed. FIG. 12 is a plan view of the sensor board 10, the circuit board 20 and the lead frame 50 of FIG. 11 which are viewed from the upper side. Hatching is applied to FIG. 12 for identification for the sake of convenience.

In this embodiment, the circuit board 20 is designed to be larger than or substantially equal to the sensor board 10. This construction is effective for the case in which the circuit board 20 overhangs the sensor board 10.

As shown in FIGS. 11 and 12, the overhang area 20a which does not face the one surface 11 of the sensor board 10 and overhangs from the sensor board 10 exists on the back surface 22 of the circuit board 20 facing the sensor board 10. The lead frame 50 is bonded to the overhang area 20a of the circuit board 20.

In this case, as shown in FIGS. 11 and 12, an opening portion 51 is formed as a board mount portion (chip mount portion) in the lead frame 50, and the sensor board 10 is mounted in the opening portion 51.

This construction can be manufactured by mounting and fixing the unified circuit board 20 and sensor board 10 onto the lead frame 50 through an adhesive member. Alternatively, it may be manufactured by mounting and fixing the circuit board 20 onto the lead frame 50 through an adhesive member and then fixing the sensor board 10 to the circuit board 20 through a bonding member.

According to this embodiment, the sensor board 10 formed of silicon or the like is not directly fixed to the lead frame of metal. Resultantly, the sensor board 10 hardly suffers from the effects of thermal stress occurring due to temperature variation caused by the difference in thermal expansion coefficient between the sensor board 10 and the lead frame 50. This contributes to stabilization of the sensor characteristics such as the characteristic of the movable portion 13, etc.

Furthermore, in the acceleration sensor S5 shown in FIG. 11, it is preferable that the sensor board 10 and the circuit board 20 are coated by the soft material 85. Therefore, the thermal stress effect of the mold material 80 on the sensor board 10 can be moderated.

Sixth Embodiment

Figure 13:
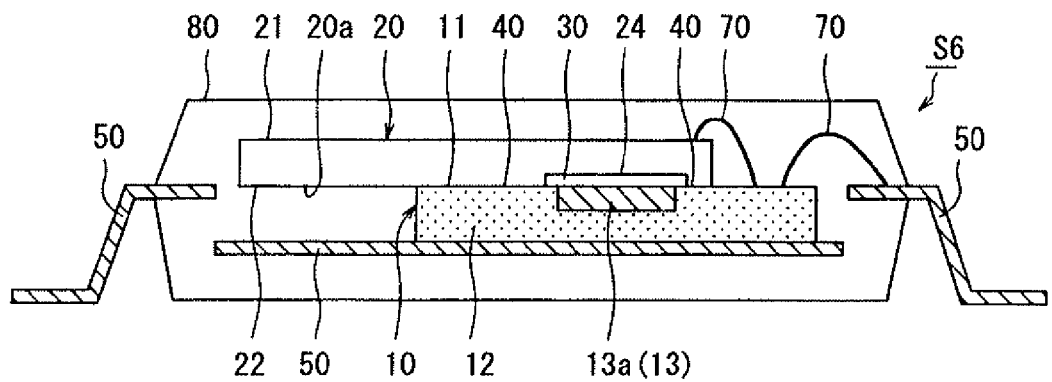
FIG. 13 is a schematic cross-sectional view showing an acceleration sensor according to a sixth embodiment of the present invention.

FIG. 13 is a schematic cross-sectional view showing the construction of an acceleration sensor S6 as a dynamic quantity according to a sixth embodiment of the present invention. This embodiment is a modification of the fifth embodiment.

When the circuit board 20 is larger than or substantially equal to the sensor board 10 and thus overhangs from the sensor board 10, the other surface 12 at the opposite side to the one surface 11 of the sensor board 10 which faces the circuit board 20 may be bonded to the lead frame 50.

Seventh Embodiment

Figure 14:
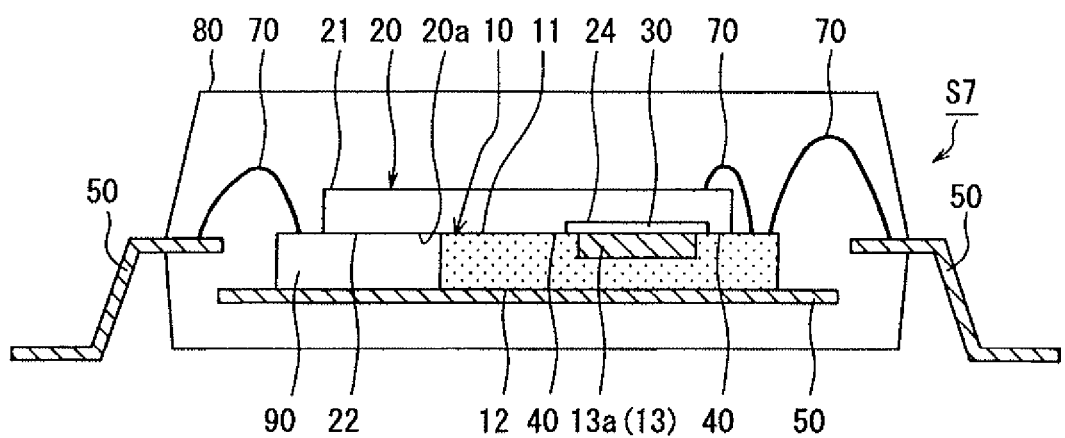
FIG. 14 is a schematic cross-sectional view showing an acceleration sensor according to a seventh embodiment of the present invention.

FIG. 14 is a schematic cross-sectional view showing an acceleration sensor S7 as a dynamic quantity sensor according to a seventh embodiment of the present invention.

This embodiment is a modification of the sixth embodiment. In this embodiment, the overhang area 20a of the circuit board 20 is equipped with a separate board 90 separated from the sensor board 10, and the circuit board 20 is supported by the separate board 90.

The separate board 90 may be a second circuit board which is an IC chip separated from the circuit board 20, or a dummy chip formed of a plate-shaped silicon member or the like. The separate board 90 is adhesively fixed to the lead frame 50; however, it is not necessarily bonded to the circuit board 20.

According to this embodiment, since the overhang area 20a of the circuit board 20 is supported by the separate board 90, the circuit board 20 can be stably supported, and bonding performance can be easily secured in such a case that wire bonding is carried out at the site corresponding to the overhang area 20a of the circuit board 20, for example.

Figure 15:
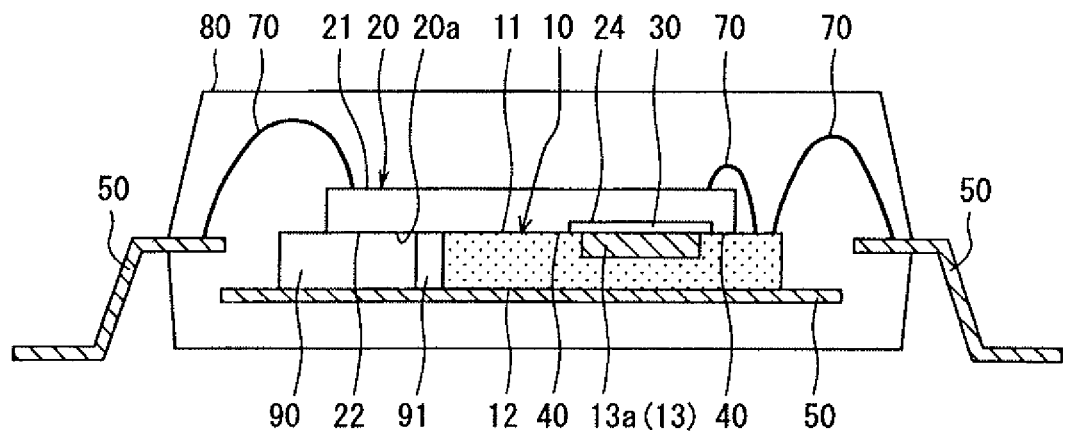
FIG. 15 is a schematic cross-sectional view showing a modification of the seventh embodiment.

In FIG. 14, the sensor board 10 and the separate body 90 are brought into contact with each other. However, as shown in FIG. 15, the sensor board 10 and the separate board 90 may be disposed so as to be spaced from each other through a separating portion 91.

Eighth Embodiment

Figure 16:
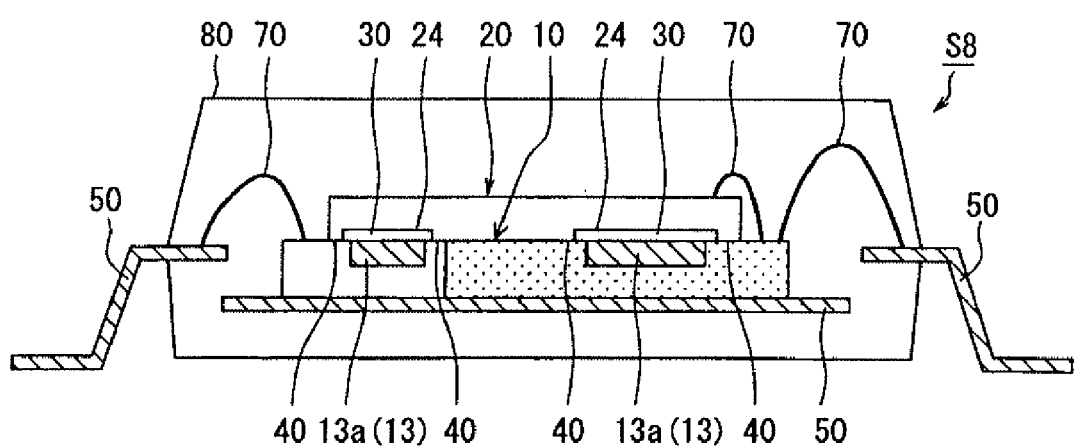
FIG. 16 is a schematic cross-sectional view showing an acceleration sensor according to an eighth embodiment of the present invention.

FIG. 16 is a schematic cross-sectional view showing an acceleration sensor S8 as a dynamic quantity sensor according to an eighth embodiment of the present invention.

This embodiment is a modification of the seventh embodiment. In place of the separate board, second, third, or more sensor boards 10 are equipped to the overhang area 20a of the circuit board 20, and bonded to the circuit board 20 to support the circuit board 20.

More particularly, according to this embodiment, each of the plurality of sensor boards 10 is equipped with a movable portion 13 at one surface side thereof so that the movable portion 13 is sealed by a common circuit board 20 and a bonding portion 40 so as to face the common circuit board 20 through the gap portion 30 and be assembled and unified with the common circuit board 20.

When the circuit board 20 is larger than one sensor board 10 and the sensor includes a plurality of sensor boards 10, an overhang area exists for one sensor board 10 on the circuit board 20. In this case, the other sensor boards 10 have the same effect as the separate board.

Furthermore, according to this embodiment, a plurality of sensor boards 10 can be arranged by one circuit board 20, and also a multi-axial sensor which can detect in the multi-axial directions can be formed by the sensor boards 10 separated from one another.

Other Embodiments

The second and subsequent embodiments described above appropriately use the construction that the surface 21 of the circuit board 20 and the one surface 11 of the sensor board 10 confront each other.

Furthermore, the sensor board 10 and the circuit board 20 which are laminated and fixed as described with respect to each of the embodiments may be mounted on a print board or ceramic board or in a ceramic package in the form of a bare chip in which both the boards are unified.

When the bare chip is put on a ceramic board or print board with no resin molding and they are placed in and air-tightly sealed in another package, or when the bare chip is put in a ceramic package, it is unnecessary that the bonding portion 40 between the circuit board 20 and the sensor board 10 be designed in such an air-tight structure as to surround the gap portion 30, and it is sufficient to secure the gap portion 30 and the bonding strength.

Figure 17A:
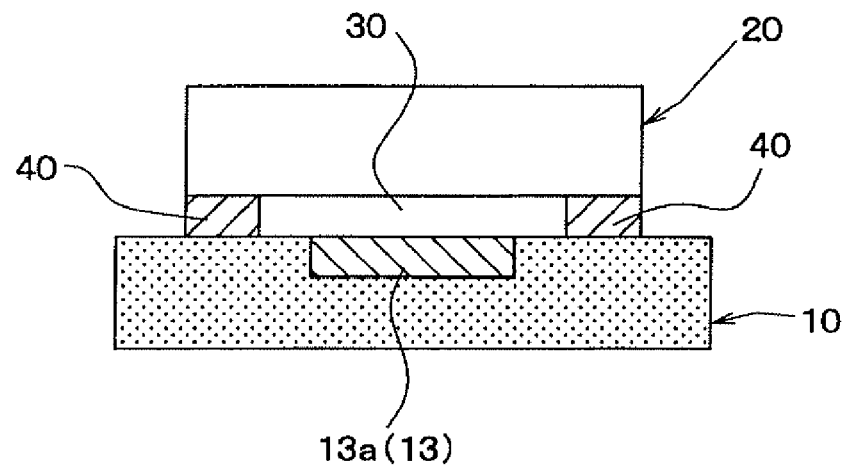
FIGS. 17A and 17B are diagrams showing the construction of the main part of an acceleration sensor according to another alternative embodiment of the present invention.
Figure 17B:
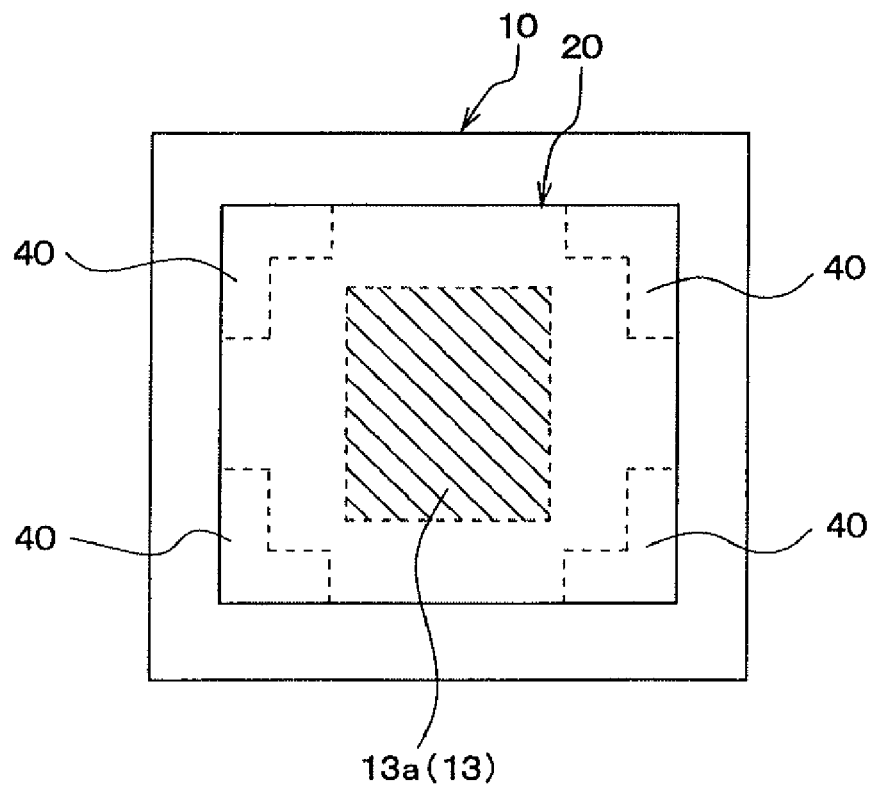

The above embodiment is shown in FIGS. 17A and 17B, wherein FIG. 17A is a cross-sectional view and FIG. 17B is a plan view which is viewed from the top side. The bonding portion 40 is partially equipped to the corner portions of the circuit board 20, and the sensor board 10 and the circuit board 20 are partially bonded to each other on the periphery of the gap portion 30. In this case, the movable portion 13 of the sensor board 10 is also covered by the circuit board 20 through the gap portion 30, so that the movable portion 13 is appropriately protected from the external.

Figure 18:
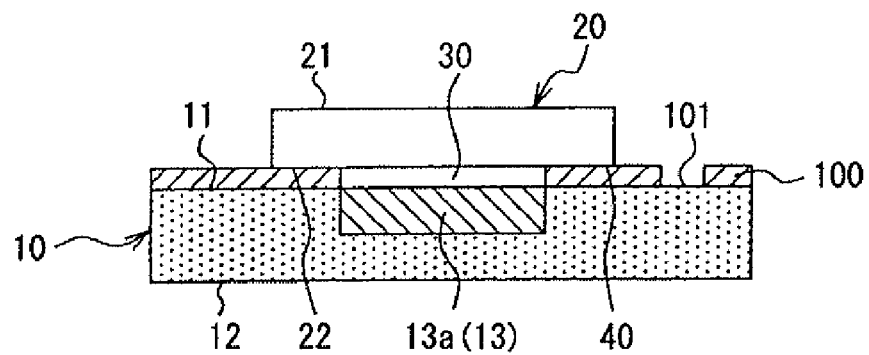
FIG. 18 is a diagram showing the construction of the main part of an acceleration sensor according to a ninth embodiment of the present invention.
Figure 19:
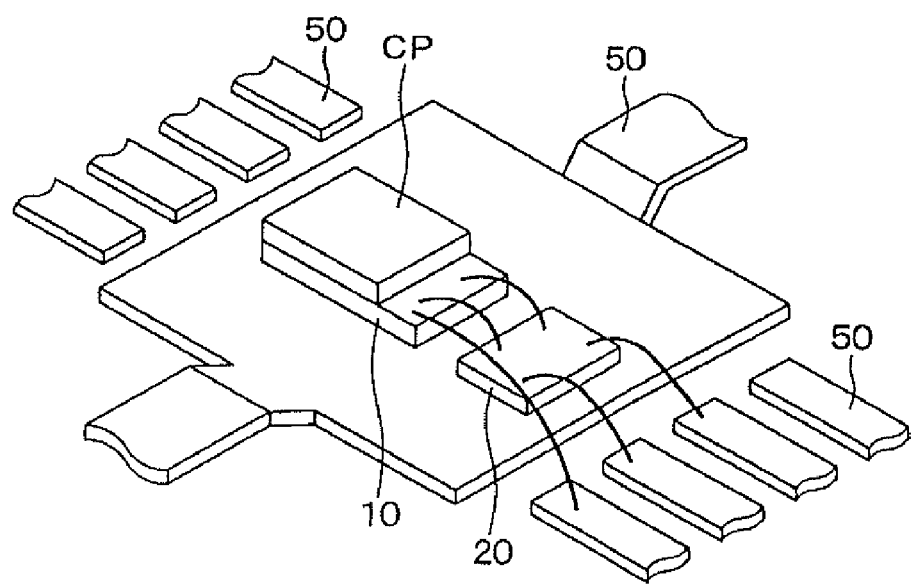
FIG. 19 is a perspective view showing a conventional general construction of a dynamic quantity sensor having a sensor board and a circuit board.

FIG. 18 is a cross-sectional view schematically showing the construction of an acceleration sensor according to another embodiment of the present invention.

In the embodiment shown in FIG. 18, the circuit board 20 is disposed so that the back surface 22 thereof confronts one surface 11 of the sensor substrate 10 through the gap portion 30 so as to cover the sensing portion 13a. The bonding portion 40 surrounding the gap portion 30 is formed by anodic bonding through a glass layer 100 formed on the one surface 11 of the sensor substrate 10.

The device of this embodiment is formed as follows. After an Al wiring portion (not shown) is formed, by using the sputtering method, the CVD method or the like, for example, a glass layer 100 is formed over the whole surface of wafer on which many acceleration sensors (dynamic quantity sensors) are formed. In this embodiment, for example, borosilicate glass is formed, and then the surface thereof is polished by CMP or the like so that it is finished to have a mirror-surface state.

Subsequently, the glass layer 100 is partially removed by photolithographic etching at a site which will serve as a sensing portion containing a movable portion and also at a Al-pad forming site 101 to be subjected to wire bonding. Subsequently, the movable portion 13, etc. are formed at the site of the sensing portion 13a by dry etching or the like.

The mirror-polished back surface 22 of the circuit board 20 having circuits formed thereon and the upper surface of the glass layer 100 which is formed on the sensor board 10 and subjected to mirror-surface polishing are subjected to anodic bonding. As described above, both the boards 10, 20 may be directly bonded to each other without being connected to each other through adhesive agent or a metal barrier layer.

Furthermore, if the mirror surfaces are smoothened with high precision, they can be directly and firmly bonded to each other without anodic bonding by merely bringing them into contact with each other. In this case, the direct bonding progresses more surely by setting the temperature from 400° C. to 500° C.

This embodiment may be also applied to the cases shown in FIGS. 7 and 8. More particularly, FIG. 7 shows the structure that the movable portion 13 is located at a lower position than the one surface 11 of the sensor substrate 10, and FIG. 8 shows the structure that the recess portion 24 is formed on the back surface 22 of the circuit board 20.

In these cases, the silicon face can be directly exposed as the contact face of the sensor board 10, and thus it can be directed bonded to the silicon face of the back surface 22 of the circuit board 20 in a silicon-silicon direct bonding style. Furthermore, thermal oxide film may be formed on at least one of the silicon faces of both the boards 10 and 20 to perform the direct bonding.

The present invention is applicable to not only the acceleration sensor, but also dynamic quantity sensors such as an angular velocity sensor, a pressure sensor, etc.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A dynamic quantity sensor comprising:
    a sensor chip including a movable portion at one surface side thereof and a silicon layer at another surface side thereof, wherein the movable portion is displaced under application of a dynamic quantity and the silicon layer is separated from the movable portion by an insulator; and
    a circuit chip for communicating with the sensor chip, wherein the circuit chip is disposed to confront the one surface of the sensor chip through a gap portion and to cover the movable portion, and the sensor chip and the circuit chip are bonded to each other around the gap portion so that a bonding portion is formed that substantially surrounds and seals the gap portion, wherein
    the gap portion is sealed by sealing the sensor chip, the circuit chip and the gap bonding portion, and the movable portion is disposed within the sealed gap portion,
    the sensor chip and the circuit chip are sealingly wrapped by mold material, and
    the sensor chip and the circuit chip are sealed by soft material softer than the mold material, and the outside of the soft material is wrapped by the mold material.

2. The dynamic quantity sensor according to claim 1, further comprising a lead frame for transmitting electrical signals to an exterior, wherein the sensor chip is bonded to the lead frame on another surface opposite to the one surface of the sensor chip facing the circuit chip.

3. The dynamic quantity sensor according to claim 1, wherein the sensor chip and the circuit chip are electrically connected to each other by bonding wires.

4. The dynamic quantity sensor of claim 1, wherein the bonding portion comprises a spacer having a predetermined thickness for separating the circuit chip from the movable portion.

5. A dynamic quantity sensor comprising:
    a sensor chip including a movable portion at one surface side thereof, wherein the movable portion is displaced under application of a dynamic quantity; and
    a circuit chip for communicating with the sensor chip, wherein the circuit chip is disposed so as to confront one surface of the sensor chip through a gap portion and to cover the movable portion, and wherein the sensor chip and the circuit chip are partially bonded to each other around the gap portion, wherein
    the movable portion is disposed within a sealed gap that is sealed by sealing the sensor chip and circuit chip,
    the sensor chip and the circuit chip are sealingly wrapped by mold material, and the sensor chip and the circuit chip are sealed by soft material softer than the mold material, and the outside of the soft material is wrapped by the mold material.

6. The dynamic quantity sensor of claim 5, wherein a spacer substantially surrounds the gap portion, wherein the spacer has a predetermined thickness for separating the circuit chip from the movable portion.

7. A dynamic quantity sensor, comprising:
- a sensor chip including a movable portion that is displaceable in response to application of a dynamic quantity; and
- a circuit chip in communication with the sensor chip and bonded to the sensor chip so as to define a sealed gap therebetween in which the movable portion of the sensor chip is disposed;
- a sealant that encapsulates the sensor chip and the circuit chip and that moderates stress caused by temperature variation; and
- a mold material having a hardness greater than a hardness of the sealant and that encapsulates the sensor chip, the circuit chip and the sealant.

8. The dynamic quantity sensor of claim 7, further comprising wiring for connecting the circuit chip to the sensor chip, the wiring being substantially encapsulated by the sealant.

* * * * *